US008963641B1

(12) United States Patent  
Liu

(10) Patent No.: US 8,963,641 B1  
(45) Date of Patent: Feb. 24, 2015

(54) SOURCE-SERIES TERMINATED DIFFERENTIAL LINE DRIVER CIRCUIT

(71) Applicant: Maxim Integrated Products, Inc., San Jose, CA (US)

(72) Inventor: Edward W. Liu, Milpitas, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 100 days.

(21) Appl. No.: 13/887,606

(22) Filed: May 6, 2013

Related U.S. Application Data

(60) Provisional application No. 61/787,708, filed on Mar. 15, 2013.

(51) Int. Cl.  
*H03F 3/45* (2006.01)

(52) U.S. Cl.  
CPC .................................... *H03F 3/4508* (2013.01)  
USPC .......................................... 330/261; 330/260

(58) Field of Classification Search  
USPC .................... 330/261, 260, 252, 310, 152, 98  
See application file for complete search history.

(56) References Cited

U.S. PATENT DOCUMENTS

| 5,323,121 | A  | * | 6/1994 | Butler ............................ 330/252 |
| 7,425,867 | B2 | * | 9/2008 | Aemireddy et al. ........... 330/257 |
| 2003/0112069 | A1 | * | 6/2003 | Kim et al. ...................... 330/252 |
| 2011/0109388 | A1 | * | 5/2011 | Touzard et al. ................ 330/260 |
| 2011/0234318 | A1 |   | 9/2011 | Abugharbieh et al. |

* cited by examiner

*Primary Examiner* — Henry Choe  
(74) *Attorney, Agent, or Firm* — Advent, LLP

(57) ABSTRACT

A differential amplifier circuit that includes a negative resistor in parallel to synthesize a larger source resistance is disclosed. In one or more implementations, a differential amplifier circuit includes a first transistor and a second transistor. The first transistor is configured to receive a first differential input and the second transistor is configured to receive a second differential input. The differential amplifier circuit also includes a third transistor and a fourth transistor that form a pair of cross-coupled transistors coupled to the first transistor and the second transistor. The pair of cross-coupled transistors are configured to generate a negative impedance at an output node, and the negative impedance, combined with an impedance of the first transistor, is configured to generate a sufficient termination impedance for a transmission line electrically connected to the output node.

20 Claims, 3 Drawing Sheets

US 8,963,641 B1

SOURCE-SERIES TERMINATED DIFFERENTIAL LINE DRIVER CIRCUIT

CROSS-REFERENCE TO RELATED APPLICATIONS

The present application claims the benefit under 35 U.S.C. §119(e) of U.S. Provisional Application Ser. No. 61/787,708, entitled SOURCE-SERIES TERMINATED DIFFERENTIAL LINE DRIVER CIRCUIT, filed on Mar. 15, 2013. U.S. Provisional Application Ser. No. 61/787,708 is herein incorporated by reference in its entirety.

BACKGROUND

Integrated circuit devices may drive signals to and receive signals from other integrated circuit devices within one or more networks. These networks may include a medium for allowing the transmission of signals between the various devices. For example, a signal medium may comprise one or more transmission lines. Transmission lines are cables that are configured to carry high frequency signals. These transmission lines typically have an impedance of fifty ohms (50Ω) to match the output impedance of a transmitter and the input impedance of a receiver.

SUMMARY

A differential amplifier circuit (e.g., a voltage mode driver) that includes a negative resistor in parallel to synthesize a larger source resistance is disclosed. The negative resistor serves to at least partially reduce insertion loss within the differential amplifier circuit as compared to other differential amplifier configurations. In one or more implementations, a differential amplifier circuit includes a first transistor and a second transistor. The first transistor is configured to receive a first differential input and the second transistor is configured to receive a second differential input. The differential amplifier circuit also includes a third transistor and a fourth transistor that form a pair of cross-coupled transistors coupled to the first transistor and the second transistor. The pair of cross-coupled transistors is configured to generate a negative impedance at an output node, and the negative impedance, combined with an impedance of the first transistor, is configured to generate sufficient termination impedance for a transmission line electrically connected to the output node.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. The use of the same reference numbers in different instances in the description and the figures may indicate similar or identical items.

DETAILED DESCRIPTION

Overview

Differential amplifier drivers are configured to amplify a different between two voltages but do not amplify particular voltages. Differential amplifier drivers are typically utilized to transmit signals within a transmission line environment. Some requirements of transmission line drivers are that the source resistance matches the line characteristic impedance (e.g., a fifty ohm (50Ω) single-ended termination). A driver may utilize a resistor connected in series to match the line impedance; however, the resistor may create a voltage divider that results in a 6 dB insertion loss (i.e., final signal amplitude at the input of the transmission line is half of the amplitude signal of the source voltage). In contrast, a current mode driver utilizes a resistor connected in parallel to match the line impedance. This resistor in parallel reduces insertion loss; however, the current mode driver is prone to higher current consumption.

Accordingly, a differential amplifier circuit (e.g., a voltage mode driver) that includes a negative resistor in parallel to synthesize a larger source resistance is disclosed. The negative resistor serves to at least partially reduce insertion loss within the differential amplifier circuit as compared to other differential amplifier configurations. In one or more implementations, a differential amplifier circuit includes a first transistor and a second transistor. The first transistor is configured to receive a first differential input and the second transistor is configured to receive a second differential input. The differential amplifier circuit also includes a third transistor and a fourth transistor that form a pair of cross-coupled transistors coupled to the first transistor and the second transistor. The pair of cross-coupled transistors is configured to generate a negative impedance at an output node, and the negative impedance, combined with an impedance of the first transistor, is configured to generate sufficient termination impedance for a transmission line electrically connected to the output node. In some implementations, the differential amplifier includes an inductor that is configured to at least partially suppress positive feedback at high frequencies.

Example Implementations

Figure 1:
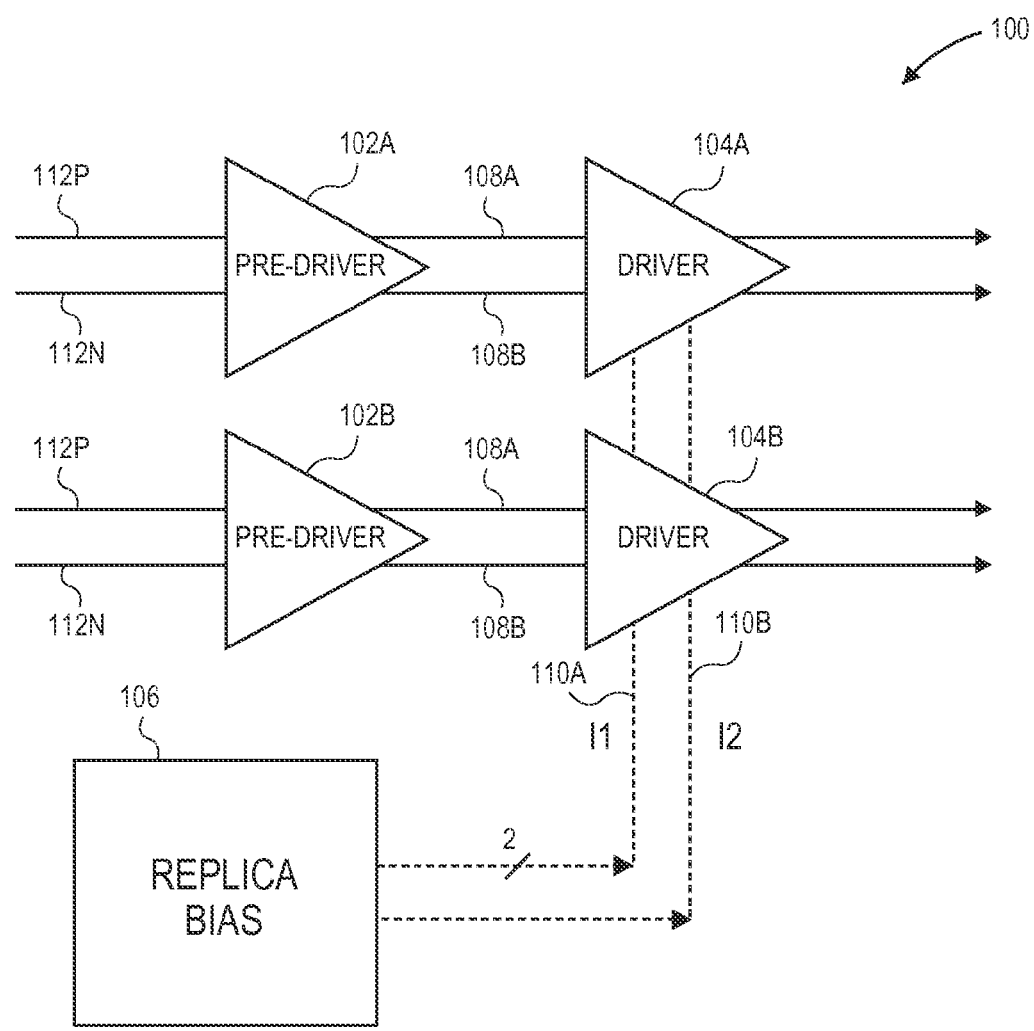
FIG. 1 is a block diagram illustrating a differential driver circuit system in accordance with an example implementation of the present disclosure.

Referring to FIG. 1, a system 100, such as a differential signal driver circuit, in accordance with an example implementation of the present disclosure is shown. The system 100 includes pre-driver circuits 102A, 102B, driver circuits 104A, 104B (e.g., source-series differential line drivers), and a replica bias circuit 106. The pre-driver circuits 102A, 102B may be implemented as differential current mode amplifiers, or the like. The driver circuits 104A, 104B are electrically connected via a differential electrical interface 108 (108A, 108B), and the replica bias circuit 106 is electrically connected to the driver circuits 104A, 104B via an electrical interface 110. In one or more implementations, the system 100 is configured to transfer data through the circuit 100 by way of a differential signal furnished by the differential signal inputs 112P, 112N (i.e., electrodes). The inputs 112P, 112N are configured to furnish a differential signal having opposite (e.g., a positive and a negative) signal phases.

Figure 2:
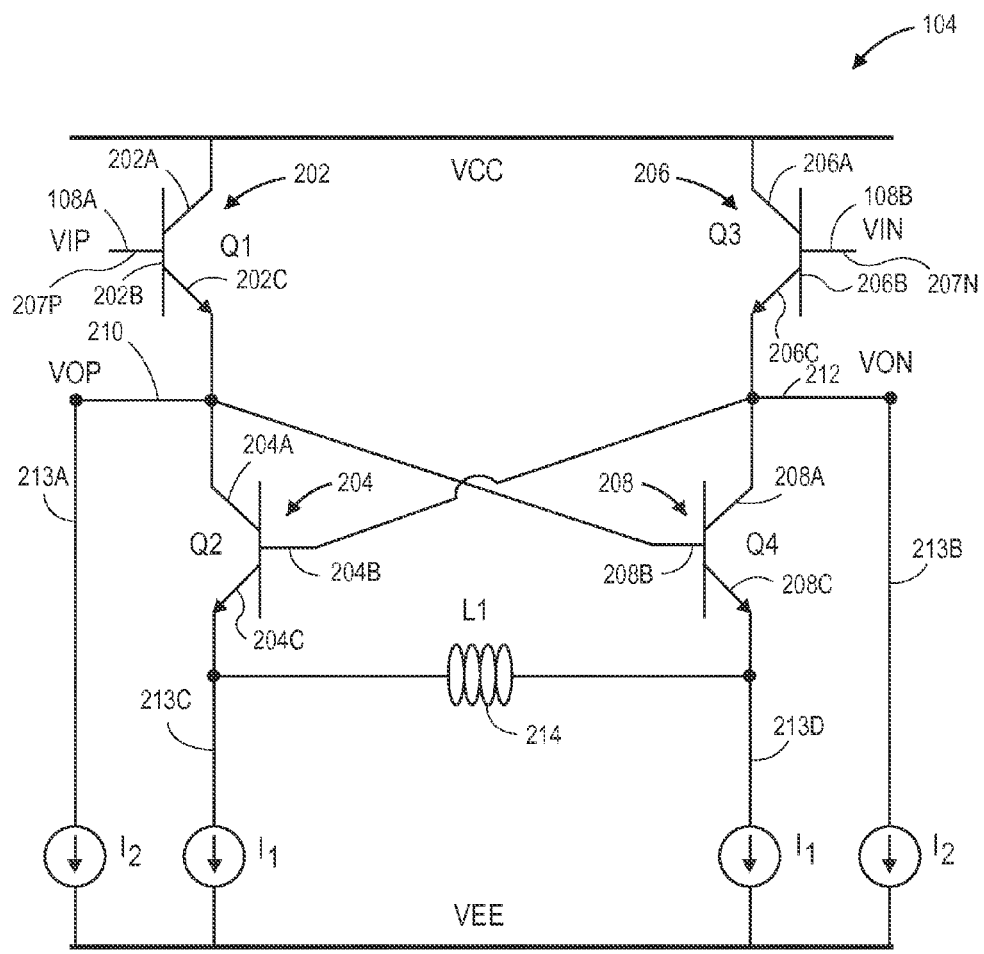
FIG. 2 is a circuit diagram illustrating a differential driver circuit in accordance with an example implementation of the present disclosure

FIG. 2 illustrates an example driver circuit 104 (e.g., a driver circuit 104A or a driver circuit 104B) according to an example implementation of the present disclosure. The driver circuit 104 is configured to provide a corresponding differential output signal (i.e., a differentially amplified signal) in response to a received differential input signal. The driver circuit 104 is then configured to output the differential signal to a transmission line. In an implementation of the present disclosure, the driver circuit 104 comprises a source-series actively terminated driver core that includes a plurality of cores. For example, the plurality of cores comprise a first transistor 202 (Q1), a second transistor 204 (Q2), a third transistor 206 (Q3), a fourth transistor 208 (Q4) that comprise the differential amplifier circuitry. It is understood that the transistors may be configured in a variety of ways. For example, the transistors 202, 204, 206, 208 may be bipolar junction transistors, complementary metal-oxide-semiconductor (CMOS) transistors, combinations thereof, or the like. For instance, each of the transistors 202, 204, 206, 208 may be comprised of bipolar junction transistors. For example, the transistors 202, 204, 206, 208 may be configured as NPN transistors or PNP transistors. In another instance, each of the transistors 202, 204, 206, 208 may be comprised of complementary metal-oxide-semiconductor (CMOS) transistors. In yet another instance, the transistors 202, 206 may be complementary metal-oxide-semiconductor transistors and the transistors 204, 208 may be bipolar junction transistors, or vice versa.

In the implementation shown in FIG. 2, each transistor includes a respective collector 202A, 204A, 206A, 208A; a respective base 202B, 204B, 206B, 208B; and a respective emitter 202C, 204C, 206C, 208C. The driver circuit 104 is configured to at least substantially eliminate, or reduce, insertion loss. For example, the driver circuit 104 is configured to reduce, or at least substantially eliminate, insertion loss in source-series terminated line drivers using a positive feedback network. As shown in FIG. 2, the bases of the transistors 204, 208 (204B, 208B) are cross-coupled to form a positive feedback network, and the transistors 202, 206 comprise emitter followers. The bases 202B, 206B are coupled to respective differential voltage inputs 207P, 207N (i.e., electrodes). The differential voltage inputs 207P, 207N are coupled to the respective outputs (i.e., electrical interfaces 108A, 108B) of a corresponding pre-driver circuit 102A, 102B.

As described above, the transistors 204, 208 comprise cross-coupled transistors. Specifically, the base 208B of the transistor 208 is electrically connected to the emitter 202C of the transistor 202 and the collector 204A of the transistor 204, and the base 204B of the transistor 204 is electrically connected to the emitter 206C of the transistor 206 and the collector 208A of the transistor 208. The cross-coupled transistors 204, 208 are configured to form a positive feedback configuration, which generates a negative resistance (impedance) at the collector 204A of the transistor 204. That negative resistance, in parallel with the impedance of the emitter 202C of the transistor 202, is sufficient to generate the necessary termination impedance (e.g., a fifty ohm (50Ω) termination) for a transmission line. Thus, the impedance at a node 210 (VOP) (or at a node 212 (VON)), which the system 100 is operational, is the impedance of the collector 204A of the transistor 204 in parallel with the impedance of the emitter 202C of the transistor 202. The total impedance at the node 210 can be modeled by:

$$R = 1/(g_{m1} - g_{m2}) \qquad \text{EQ. 1,}$$

where $g_{m1}$ represents the transconductance of the transistor 202 and $g_{m2}$ represents the transconductance of the transistor 204. In the same manner as described above, it is contemplated that the impedance at the node 212 is also sufficient to generate the necessary termination impedance (e.g., a fifty ohm (50Ω) termination value) for a transmission line due to the cross-coupling of the transistors 204, 208, as well as the impedance attributed to the collector 208A and the impedance attributed to the emitter 206C.

The transconductance of each transistor is set by one or more bias currents, which are denoted as I1 and I2 in FIG. 2. In order to assist in maintaining stability within the driver core 104, the transconductance gm1 is larger than the transconductance gm2. Thus, as shown in FIG. 2 for a bipolar transistor implementation example, the bias current through the transistor 202 is I1 and I2 (i.e., I1+I2), while the bias current through the transistor 204 is equal to I1. The bias current for the system 100 is generated utilizing the replica bias circuit 106, which is described in greater detail herein. Thus, the transconductances of the system 100 cores are set by the replica bias circuit 106. Thus, the driver circuit 104 includes two current branches (e.g., current path) 213A, 213B corresponding to the I2 bias current and two current branches 213C, 213D corresponding to the I1 bias current.

As shown in FIG. 2, the driver circuit 104 also includes an inductor 214 coupled between the emitter 204C and the emitter 208C. The inductor 214 is configured to at least partially suppress positive feedback, which improves (reduces) return loss, at high frequency operation beyond a few giga-hertz.

As described above, the replica bias circuit 106 is configured to multiple bias currents to control the transconductances of the driver circuit 104 cores (e.g., transistors 202, 204, 206, 208). In the implementation shown in FIG. 1, the replica bias circuit 106 is configured to generate four (4) bias currents for the driver circuits 104(A), 104(B). For example, the replica bias circuit 106 is configured to generate two I1 currents (a first I1 current for the driver circuit 104(A) and a second I1 current for the driver circuit 104(B)) and two I2 currents (a first I2 current for the driver circuit 104(A) and a second I2 current for the driver circuit 104(B)).

Figure 3:
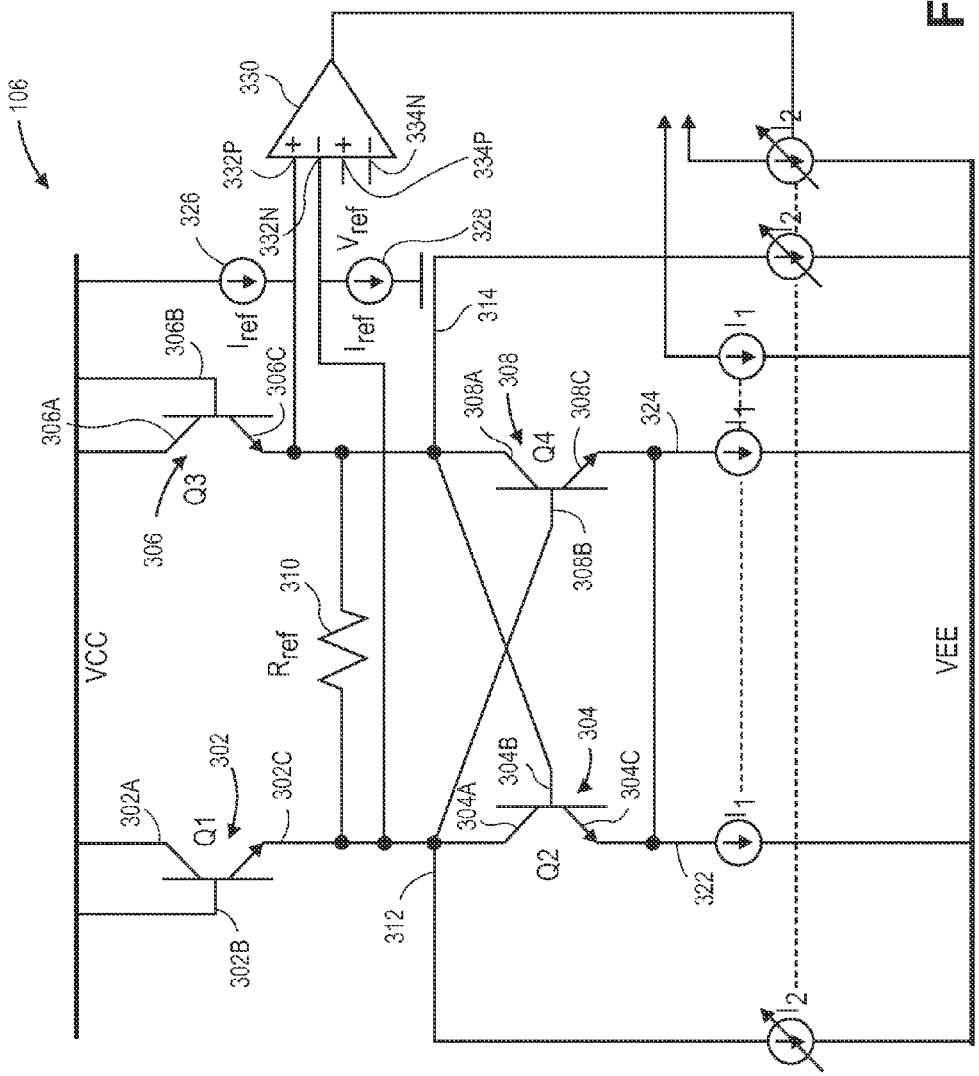
FIG. 3 is a circuit diagram illustrating a replica bias circuit in accordance with an example implementation of the present disclosure.

FIG. 3 illustrates a replica bias circuit 106 in accordance with an example implementation of the present disclosure. As shown, the replica bias circuit 106 includes a first transistor 302, a second transistor 304, a third transistor 306, and a fourth transistor 308. It is understood that the transistors may be configured in a variety of ways. For example, the transistors 302, 304, 306, 308 may be bipolar junction transistors, complementary metal-oxide-semiconductor (CMOS) transistors, combinations thereof, or the like. For instance, each of the transistors 302, 304, 306, 308 may be comprised of bipolar junction transistors. For example, the transistors 302, 304, 306, 308 may be configured as NPN transistors or PNP transistors. In another instance, each of the transistors 302, 304, 306, 308 may be comprised of complementary metal-oxide-semiconductor (CMOS) transistors. In yet another instance, the transistors 302, 306 may be complementary metal-oxide-semiconductor transistors and the transistors 304, 308 may be bipolar junction transistors, or vice versa.

In the implementation shown in FIG. 3, each transistor includes a respective collector 302A, 304A, 306A, 308A; a respective base 302B, 304B, 306B, 308B; and a respective emitter 302C, 304C, 306C, 308C.

The replica bias circuit 106 includes a resistance 310 that is coupled between a node 312 and a node 314. As shown, the resistance 310 is coupled in parallel with the output of the circuit 106 (i.e., coupled in parallel with nodes 312, 314). In one or more implementations, the resistance 310 comprises a reference resistive value that is at least approximately equal to the output resistance of the driver circuit 104. For example, the resistance 310 may have a resistive value of at least approximately one hundred ohms (100Ω), which causes the overall output resistance (i.e., output resistance at node 312 or at node 314) of the circuit 106 to be at least approximately fifty ohms (50Ω).

The replica bias circuit 106 also includes one or more reference current sources 326, 328. The reference current sources are small and do not require precision of better than 20%. The reference current sources 326, 328 are utilized to continually determine the output resistance at the respective nodes 312, 314. For example, the output voltage may be modeled by:

$$V_{OUT}=I_{REF}(R_{REF}/2) \qquad \text{EQN. 2.}$$

If we set $V_{REF}=I_{REF}*R_{REF}/2$, $R_{REF}$ is given by:

$$R_{REF}=2R=2V_{REF}/I_{REF}=2/(g_{m1}-g_{m2}) \qquad \text{EQN. 3}$$

It is understood that the transconductance utilized in EQN. 3 is the transconductance of corresponding transistors in the replica bias circuit.

As shown in FIG. 3, the replica bias circuit 106 also includes an operational amplifier 330 configured to adjust the I2 bias currents provided to respective driver circuits 104(A), 104(B). For example, the operational amplifier 330 is configured to adjust the I2 bias currents such that the output voltage ($V_{OUT}$) tracks a voltage reference ($V_{REF}$). In one or more implementations, the voltage reference is set to $I_{REF}*(R_{REF}/2)$. As shown, the voltage reference is provided as differential inputs 332P, 332N to the operational amplifier 330. The two remaining differential inputs 334P, 334N of the operational amplifier 330 are connected to nodes 314, 312, respectively. Thus, the operational amplifier 330 is configured to continually determine (detect) changes in voltage at the nodes 312, 314 as compared to the voltage reference, which may be due to differences in process, voltage, and/or temperature. Based upon the determined (detected) changes in voltage at the nodes 312, 314, the operational amplifier is configured to adjust the bias currents I2 such that the driver output resistance at nodes 312, 314 is at least approximately to $R_{REF}$. The bias currents I1 and I2 are then mirrored to respective driver circuits 104(A), 104(B).

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A differential amplifier circuit comprising:
a first transistor and a second transistor, the first transistor configured to receive a first differential input and the second transistor configured to receive a second differential input; and
a third transistor and a fourth transistor comprising a pair of cross-coupled transistors coupled to the first transistor and the second transistor, the pair of cross-coupled transistors configured to generate a negative impedance at an output node,
wherein the negative impedance combined with an impedance of the first transistor is configured to generate a sufficient termination impedance for a transmission line electrically connected to the output node.

2. The differential amplifier circuit as recited in claim 1, further comprising an inductor coupled in parallel with the third transistor and the fourth transistor to at least partially improve return loss.

3. The differential amplifier circuit as recited in claim 1, wherein the first transistor is electrically connected to a first pre-driver circuit output and the second transistor is electrically connected to a second pre-driver circuit output.

4. The differential amplifier circuit as recited in claim 1, wherein at least one of the first transistor, the second transistor, the third transistor, or the fourth transistor comprises bipolar junction transistors.

5. The differential amplifier circuit as recited in claim 4, wherein the at least one bipolar junction transistor comprises an NPN bipolar junction transistor.

6. A system comprising:
a differential amplifier circuit, the differential amplifier circuit including:
a first transistor and a second transistor, the first transistor configured to receive a first differential input and the second transistor configured to receive a second differential input;
a third transistor and a fourth transistor comprising a pair of cross-coupled transistors coupled to the first transistor and the second transistor, the pair of cross-coupled transistors configured to generate a negative impedance at an output node;
wherein the negative impedance combined with the impedance of the first transistor is configured to generate a sufficient termination impedance for a transmission line; and
a replica bias circuit electrically coupled to the differential amplifier circuit, the replica bias circuit configured to furnish a first bias current and a second bias current to the differential amplifier circuit to furnish stability to the differential amplifier circuit against supply voltage, temperature, and process variations.

7. The system as recited in claim 6, wherein replica bias circuit comprises
a fifth transistor and a sixth transistor, and
a seventh transistor and an eighth transistor comprising a pair of cross-coupled transistors coupled to the fifth transistor and the sixth transistor;
a first output node and a second output node, the first output node formed between the fifth transistor and the seventh transistor and the second output node formed between the sixth transistor and the eighth transistor,
a reference resistance connected in parallel between the first output node and the second output node; and
an operational amplifier configured to adjust the second bias current based such that the output impedance between the first output node and the second output node is approximately equal to the reference resistance.

8. The system as recited in claim 6, wherein the operational amplifier includes a first differential input electrically connected to the first output node and a second differential input electrically connected to the second output node, wherein the operational amplifier is configured to adjust the second bias current based upon a voltage difference at the first output node and the second output node and a reference voltage.

9. The system as recited in claim 6, wherein the differential amplifier further comprises an inductor coupled in parallel with the third transistor and the fourth transistor to at least partially improve return loss.

10. The system as recited in claim 6, wherein the first transistor is electrically connected to a first pre-driver circuit output and the second transistor is electrically connected to a second pre-driver circuit output.

11. The system as recited in claim 6, wherein at least one of the first transistor, the second transistor, the third transistor, the fourth transistor, the fifth transistor, the sixth transistor, the seventh transistor, or the eighth transistor comprise bipolar junction transistors.

12. The system as recited in claim 11, wherein the at least one bipolar junction transistor comprises an NPN bipolar junction transistor.

13. The system as recited in claim 9, wherein the differential amplifier circuit is electrically connected to a pre-amplifier circuit.

14. A system comprising:
  a differential amplifier circuit, the differential amplifier circuit including:
    a first bipolar junction transistor and a second bipolar junction transistor, the first bipolar junction transistor configured to receive a first differential input and the second bipolar junction transistor configured to receive a second differential input;
    a third bipolar junction transistor and a fourth bipolar junction transistor, a base of the third bipolar junction transistor electrically coupled to a first output node and a base of the fourth bipolar junction transistor electrically coupled to a second output node, the first output node including the emitter of the second bipolar junction transistor and the collector of the fourth bipolar junction transistor, the second output node including the emitter of the first bipolar junction transistor and the collector of the third bipolar junction transistor, the base of the fourth transistor configured to generate a negative impedance at the first output node and the base of the third transistor configured to generate a negative impedance at the second output node,
    wherein the negative impedance at the first output node combined with an impedance of the emitter of the first transistor is configured to generate a sufficient termination impedance at the first output node for a first transmission line, the negative impedance at the second output node combined with an impedance of the emitter of the second transistor is configured to generate a sufficient termination impedance at the second output node for a second transmission line;
  a replica bias circuit electrically coupled to the differential amplifier circuit, the replica bias circuit configured to furnish a first bias current and a second bias current to the differential amplifier circuit to furnish stability to the differential amplifier circuit against supply voltage, temperature, and process variations.

15. The system as recited in claim 14, wherein the operational amplifier includes a first differential input electrically connected to the first output node and a second differential input electrically connected to the second output node, wherein the operational amplifier is configured to adjust the second bias current based upon a voltage difference at the first output node and the second output node and a reference voltage.

16. The system as recited in claim 14, wherein replica bias circuit comprises
  a fifth transistor and a sixth transistor; and
  a seventh transistor and an eighth transistor comprising a pair of cross-coupled transistors coupled to the fifth transistor and the sixth transistor;
  a first output node and a second output node, the first output node formed between the fifth transistor and the seventh transistor and the second output node formed between the sixth transistor and the eighth transistor,
  a reference resistance connected in parallel between the first output node and the second output node; and
  an operational amplifier configured to adjust the second bias current based such that an output impedance between the first output node and the second output node is approximately equal to the reference resistance.

17. The system as recited in claim 14, wherein the operational amplifier includes a first differential input electrically connected to the first output node and a second differential input electrically connected to the second output node, wherein the operational amplifier is configured to adjust the second bias current based upon a voltage difference at the first output node and the second output node and a reference voltage.

18. The system as recited in claim 14, wherein the differential amplifier further comprises an inductor coupled in parallel with the third transistor and the fourth transistor to at least partially improve return loss.

19. The system as recited in claim 14, wherein the first bipolar junction transistor is electrically connected to a first pre-driver circuit output and the second bipolar junction transistor is electrically connected to a second pre-driver circuit output.

20. The system as recited in claim 14, wherein at least one of the first transistor, the second transistor, the third transistor, the fourth transistor, the fifth transistor, the sixth transistor, the seventh transistor, or the eighth transistor comprise bipolar junction transistors.

\* \* \* \* \*